(12) United States Patent
Takahara

(10) Patent No.: US 6,380,557 B2
(45) Date of Patent: Apr. 30, 2002

(54) TEST CHIP FOR EVALUATING FILLERS OF MOLDING MATERIAL WITH DAMS FORMED ON A SEMICONDUCTOR SUBSTRATE TO DEFINE SLITS FOR CAPTURING THE FILLERS

(75) Inventor: Masaru Takahara, Kanagawa-ken (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/726,605

(22) Filed: Dec. 1, 2000

(30) Foreign Application Priority Data

Dec. 6, 1999 (JP) .............................. 11-346410

(51) Int. Cl.[7] ............................................. H01L 23/58
(52) U.S. Cl. ........................ 257/48; 324/765; 324/769; 438/15
(58) Field of Search ............................. 257/48; 438/15; 324/769, 765

(56) References Cited

U.S. PATENT DOCUMENTS 5,149,662 A * 9/1992 Eichelberger
5,907,190 A * 5/1999 Ishikawa et al.
6,114,627 A * 9/2000 Moden
6,274,397 B1 * 8/2001 Chien et al.

OTHER PUBLICATIONS

J. Wu et al., "Evaluation and Characterization of High–Performance Filling Encapsulants for System Chips Application," Proceedings of the 2000 Electronic Components and Technology Conference, pp. 937–943, Sep. 2000.*

* cited by examiner

Primary Examiner—Charles Bowers
Assistant Examiner—Stephen W. Smoot
(74) Attorney, Agent, or Firm—Junichi Mimura

(57) ABSTRACT

A test chip for a molding material including fillers, including, a semiconductor substrate and a test circuit formed on the substrate. The test circuit includes at least one transistor, and two dams formed on the substrate for providing a slit therebetween, the slit capturing the fillers of the molding material when the molding material is applied to the test circuit. A method for testing a molding material including fillers for a semiconductor device, including steps of preparing a test chip, placing the test chip in molding equipment, injecting the molding material including fillers into the molding equipment, capturing the fillers in the slit, and detecting the influence of the fillers on electrical characteristics of the test chip using the test circuit.

35 Claims, 4 Drawing Sheets

TEST CHIP FOR EVALUATING FILLERS OF MOLDING MATERIAL WITH DAMS FORMED ON A SEMICONDUCTOR SUBSTRATE TO DEFINE SLITS FOR CAPTURING THE FILLERS

BACKGROUND OF THE INVENTION

1. Field of the Invention

The invention relates to a test chip for molding material including fillers and a method for evaluating the molding material by using the test chip.

2. Description of the Related Art

At the very last stage of a process of manufacturing semiconductor chips, a semiconductor chip is molded with a molding material. The molding material is formed of resin with minimum chips of silica glass, which are generally called "fillers".

During the very last stage of the manufacturing process, it is well known that characteristics of a transistor of the semiconductor chip are deteriorated or that a gate oxide layer of the transistor is destroyed by the fillers because the fillers mechanically damage the surface of the semiconductor chip. Specifically, with an increase in the level of integration of semiconductor chips, a part of circuit patterns should be formed under terminal pads and the distance between the terminal pads should become short, Therefore, the problems caused by the fillers become more seriously because the fillers are stacked between the pads.

To avoid the problems described above, several proposals have been made. For example, forming a thick final passivation layer, forming a wafer coat layer between the final passivation layer and the resin, and developing a low stress resin are proposed. However, since the damage caused by the filler is varied, depending on the resin's manufacture and kinds of circuit structures formed on the semiconductor chips, these proposals are insufficient to resolve the problems described above.

Therefore, it is necessary to test the resin itself to evaluate how and what influences of fillers in resin are given to the semiconductor chip, so that the most appropriate resin can be used for each semiconductor chip in accordance of the test result of the resin itself. To perform the resin test, it is necessary to form a test circuit somewhere on the semiconductor chip. However, if a test circuit is formed somewhere on the semiconductor chip to evaluate the influence of the fillers, the filler does not always stay on the test circuit, and it is almost impossible to predict where the fillers are located on the semiconductor chip. Therefore, a test for the resin could not be performed effectively.

SUMMARY OF THE INVENTION

An objective of the invention is to capture fillers at the specific location on a test circuit easily and effectively to evaluate how and what influences of fillers in resin are given to the semiconductor chip. Further, another objective of the invention is to show the result of the evaluation quantitatively. To evaluate the influences, many test chips having different structure, many test chips formed by different steps, and many kinds of resin having different amount of fillers are prepared. By using these different materials to the different test chips, the result of the evaluation can be shown in a quantitative form.

These objectives are achieved by providing a test chip for a molding material including fillers, including, a semiconductor substrate, a test circuit formed on the substrate, the test circuit including at least one transistor, and two dams formed on the substrate for providing a slit therebetween, the slit capturing the fillers of the molding material when the molding material is applied to the test circuit.

Further, these objectives are achieved by providing a method for testing a molding material including fillers for a semiconductor device, including steps of preparing a test chip including a semiconductor substrate, a test circuit formed on the substrate, which includes at lease one transistor, and two dams formed on the substrate for providing a slit therebetween, placing the test chip in molding equipment, injecting the molding material including fillers into the molding equipment, capturing the fillers in the slit, and detecting the influence of the fillers on electrical characteristics of the test chip using the test circuit.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1:
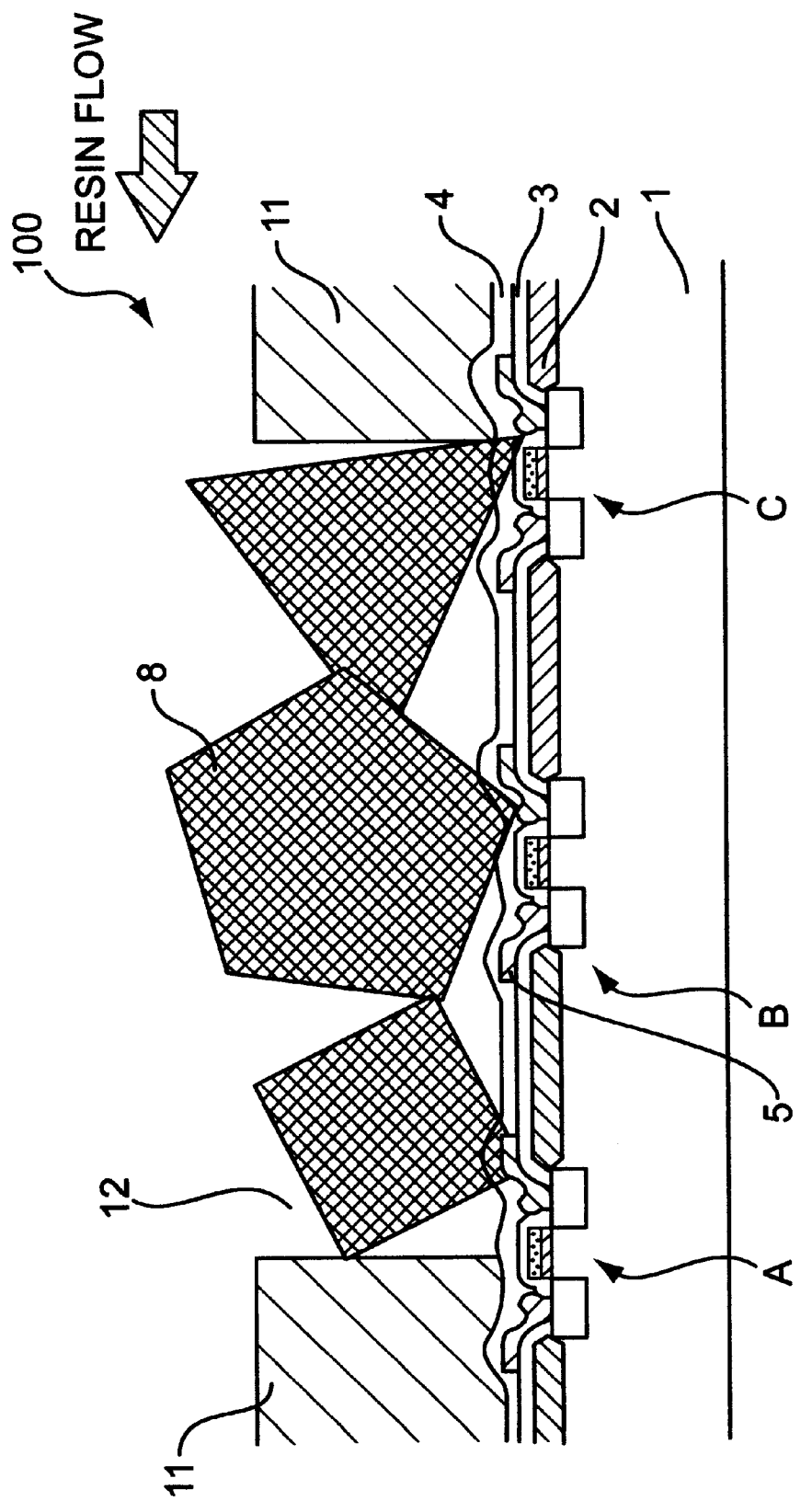
FIG. 1 is a sectional view of a test chip of a first embodiment of the invention.

Referring to FIG. 1, a test chip 100 of a first embodiment includes three transistors A, B and C. These transistors A, B and C are formed on a surface of the semiconductor substrate 1, and are separated to each other by oxide layers 2. A test circuit is formed with these three transistors A, B and C by connecting them to each other with a metal wiring layer 5 for testing electrical characteristics and functions of ROMs or DRAMs formed on the same substrate 1. The test circuit may be formed in a part of ROMs or DRAM. The test chip also includes an intermediate insulating layer 3 and a passivation layer 4, which are formed on the transistors A, B and C. Dams 11 for capturing fillers included in a resin, are formed on the passivation layer 4. The dams 11 are formed in parallel with each other to provide a slit 12 therebetween on the test circuit, so that the fillers are captured in the slits 12 which is located on the test circuit.

Furthermore, the dams 11 are formed perpendicular to a direction of resin flow. The dams 11 are formed of an insulating material such as polyimide, resist or CVD-SiO2.

To form the dams 11, the insulating layer is formed on the entire surface of the passivation layer 4, and then is patterned. The thickness of the dam 11 is set to be in the range from 30 $\mu$m to 130 $\mu$m. The width of the slit 12 is determined in the range from 150 $\mu$m to 500 $\mu$m to capture various sizes of the fillers in various formation.

The test chips 100 having the dams 11 and a slit 12 is set in a molding die of molding equipment, and then, the resin is injected into the molding equipment. The flow of the resin is indicated as an arrow in FIG. 1. The fillers 8 in the resin are stacked in the slit 12 between the dams 11. After that, since thermal stress caused by shrinkage when the resin is solidified, thermal stress when the resin is reflowed, and thermal stress caused by heat cycle, are applied to the resin, the captured fillers 8 mechanically damage the transistors A, B and C. Then, by performing a test with the test circuit, a change of electrical characteristics and defective of the functions of ROM or DRAM can be detected.

Then, the test is performed by using another resin with a test chip having the same structure described above, or using the same resin with the test chip having a different structure. By comparing the test results, it is possible to select the best resin for the actual semiconductor chip.

According to the first embodiment, it is easy and effective to capture the fillers 8 of the resin at the specific location on the test circuit because the slit 12 between the dams 11 is formed on the test circuit. Therefore, several kinds of resin having different sizes or amounts of fillers can be tested with several kinds of test chip having different structures. As a result, as it is possible to detect changes of electrical characteristics and defects in the operation of a ROM or a DRAM, the appropriate resin can be used for an actual semiconductor chip.

Further, an alternative test circuit, which does not have a passivasion layer, may be used. After testing the resin with a test chip having an alternative test circuit, the influence of the fillers on the passivation layer can be found by comparing the test results of the test circuit and the alternative test circuit.

Figure 2:
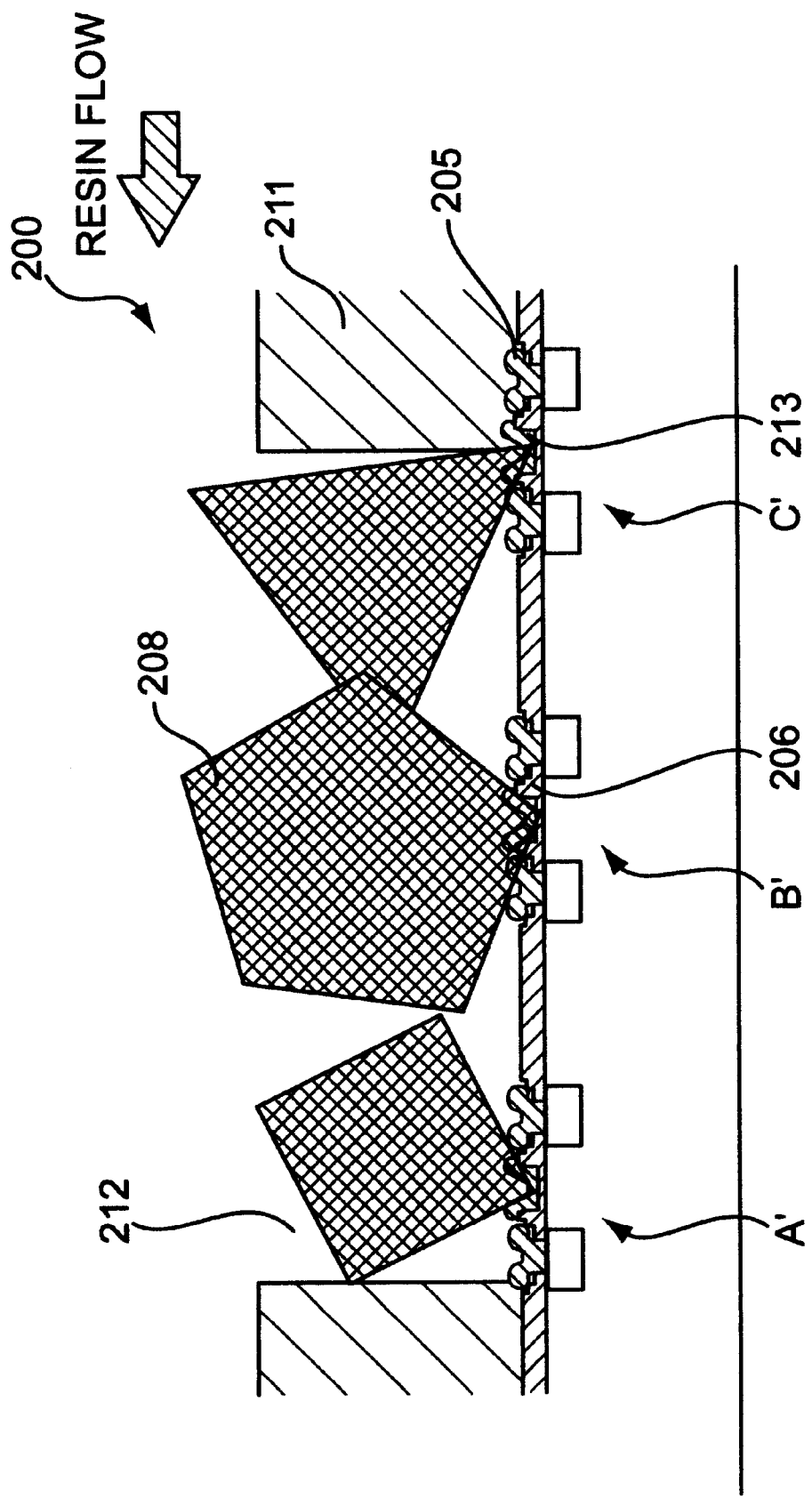
FIG. 2 is a sectional view of a test chip of a second embodiment of the invention.

Referring to FIG. 2, a test chip 200 of a second embodiment includes a test circuit having three transistors A', B' and C'. In contrast to the test chip of the first embodiment, the test chip 200 does not include an intermediate insulating layer and a passivation layer. Since there are no intermediate insulating layers, a gate electrode 213 of each transistor A', B' and C'can be formed of aluminum or copper, which is the same material as that of a metalized wire 205 for connecting the transistors to each other. Dams 211 for capturing fillers included in a resin, are formed on the exposed surface of the test chip. The dams 211 are formed in parallel with each other to provide a slit 212 therebetween on the test circuit, so that the fillers 208 are captured in the slit 212, which located on the test circuit. Furthermore, the dams 211 are formed perpendicular to a direction of resin flow. The material of the dams 211 is the same as that used in the first embodiment. Further, the process for forming the dams 211 is also the same as that described for the first embodiment. Moreover, the thickness of each dam 211 and the width of the slit 212 are the same as in the first embodiment, for the same reasons.

According to the second embodiment, since there is no intermediate insulating layers and passivation layers on the transistors A', B' and C', mechanical damage caused by the fillers 208 is applied to a gate electrode 213 of each transistors A', B' and C' directly. Therefore, an ability of the test chip to detect a change of electrical characteristics and defects in the operation of a ROM or a DRAM is increased.

Figure 3:
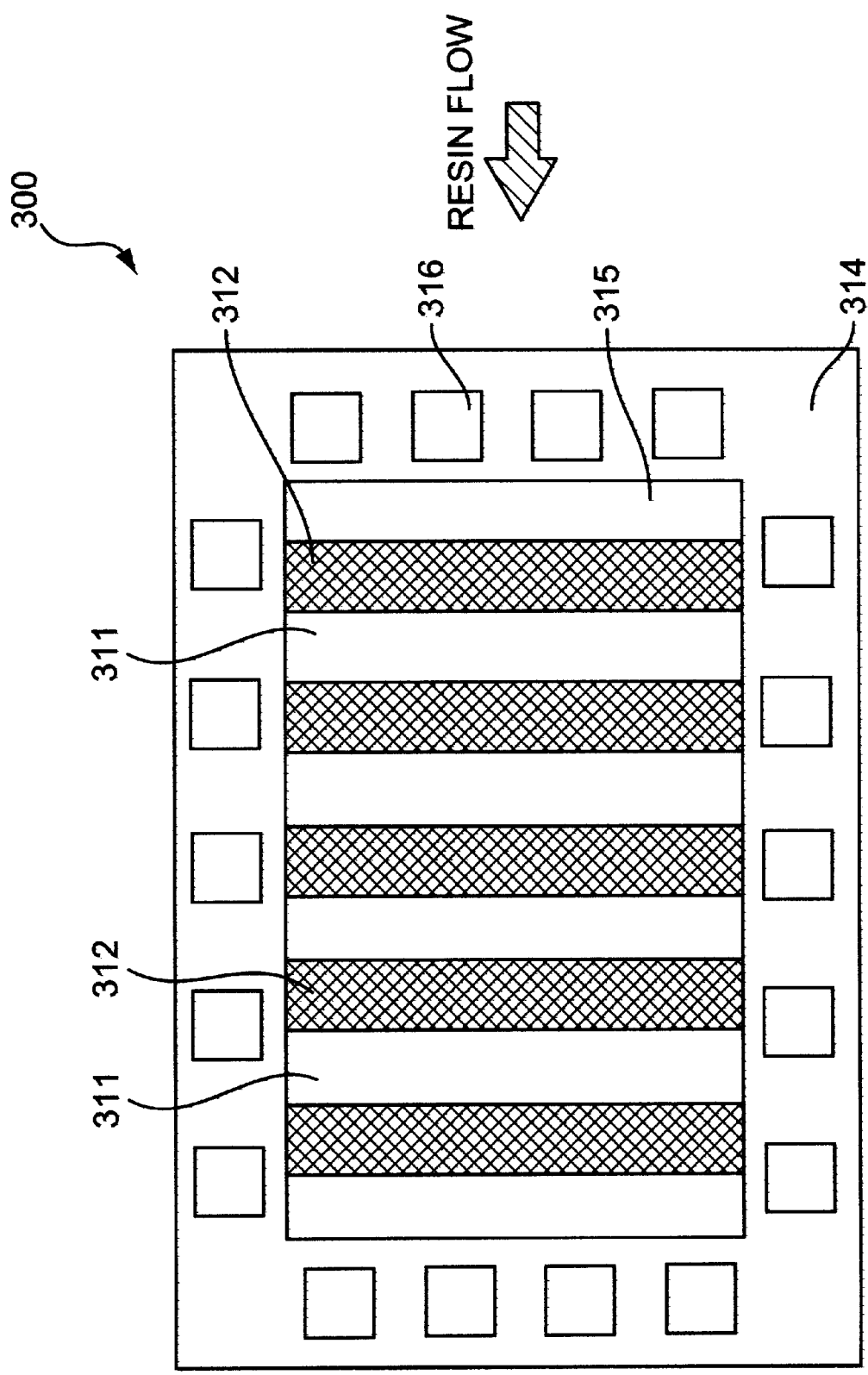
FIG. 3 is a plane view of a test chip of a third embodiment of the invention.

Referring FIG. 3, a test chip 300 of the third embodiment is described. The test chip 300 includes a transistor area 315, and a peripheral area 314 surrounding the transistor area 315. In the peripheral area, a plurality of bonding wire pads 316 is formed. A plurality of dams 311 are formed in parallel with each other to provide slits 312 therebetween in the transistor area 315. Each slit has substantially the same width, of around 500 $\mu$m, for capturing fillers contained in resin. Each dam 311 has substantially the same height, of around 130 $\mu$m, for capturing the fillers easily. Further, each dam 311 is formed to extend perpendicularly to a direction of resin flow, which is indicated by an arrow in FIG. 3. The material of the dam 311 is the same as that used in the first and second embodiments. Further, the process for forming the dams 311 is also the same as that described above for the first and second embodiments. Transistors forming a test circuit are formed at the bottom in the each slit 312. An intermediate insulating layer and a passivation layer may be formed on the transistors, as in the first embodiment. Alternatively, these layers may not be formed on the transistors, as in the second embodiment.

According to the third embodiment, since the dams 311 and the slits 312 are formed over the entire transistor area 315, it is possible to find out which location the fillers leads to the most mechanical damage to the transistors. Also, when several test circuits of different structures are formed under each slit 312, it is possible to find out what structure leads to the most mechanical damage from the fillers.

Figure 4:
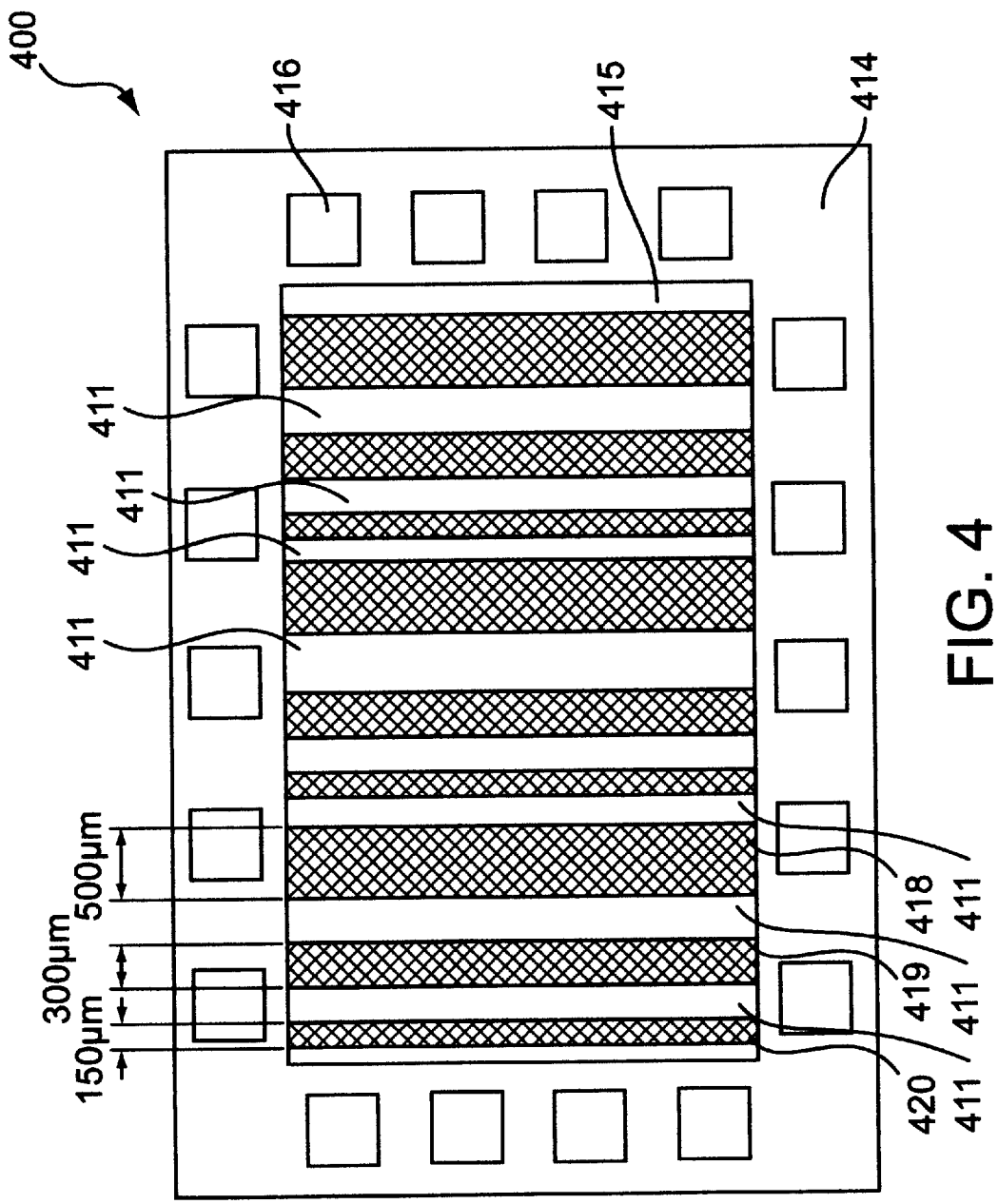
FIG. 4 is a plane view of a test chip of a fourth embodiment of the invention.

Referring to FIG. 4, a test chip 400 of the fourth embodiment is described. The test chip 400 includes a transistor area 415, and a peripheral area 414 surrounding the transistor area 415. In the peripheral area, a plurality of bonding wire pads 416 are formed. A plurality of dams 411 having the height in the range of 30–130 $\mu$m, are formed in parallel with each other to provide slits 418, 419 and 420 therebetween in the transistor area 415, each having a different width. Each dam 411 is formed to extend perpendicularly to a direction of resin flow, which is indicated by an arrow in FIG. 4. The material of the dam 411 is the same as that used in the first, second and third embodiments. Further the process for forming the dams 411 is also the same as that described above for the first, second and third embodiments. The widths of the slits 418, 419 and 420 are set to be at 500 $\mu$m, 300 $\mu$m and 150 $\mu$m, respectively. The widths of dams 411 are varied in this embodiment. However, dams having the same width may be used.

Generally, diameters of fillers contained in resin are in the range of 50–150 mm, and the diameters of the fillers depend on kinds of resin. According to the fourth embodiment, since slits having the different widths are formed, it is possible to evaluate any kind of resin. Therefore, even if the diameter of the filler is unknown, the test can be performed. If necessary, after finding the best slit width for the particular resin, using the test chip 400, a test using the test chip of the third embodiment, which chip has the best slits, may be performed.

While the invention has been described with reference to illustrative embodiments, this description is not intended to be construed in a limiting sense. For example, in the first through fourth embodiments, the influence of the fillers is tested and evaluated electrically by the test circuit. However, it is possible to evaluate the influence visually using a SEM (Scanning Electron Microscope) or a metallurgical Microscope. Therefore, it is not necessary to form a test circuit on the substrate. In this embodiment, the dams are directly formed on a silicon substrate. However, if a layer made of a material softer than fillers, is formed on the exposed substrate, it is easier to observe the influence of the fillers using the SEM. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

What I claim is:

1. A test chip for testing a molding material having fillers, comprising:

a semiconductor substrate;

a test circuit formed on the substrate, the test circuit including at least one transistor; and two dams formed on the substrate for providing a slit therebetween, the slit capturing the fillers of the molding material when the molding material is applied to the test circuit.

2. A test chip as claimed in claim 1, wherein each dam is formed in parallel, and is formed to extend perpendicularly to a direction of flow of the molding material to be applied to the test chip.

3. A test chip as claimed in claim 1, wherein the slit has a width larger than a diameter of a largest one of the fillers, and each dam has a height smaller than the largest.

4. A test chip as claimed in claim 1, further comprising:
   an insulating layer formed on at least one transistor; and
   a metalized layer formed on the insulating layer, connecting to at least one transistor.

5. A test chip as claimed in claim 4, wherein each dam is formed in parallel, and is formed to extend perpendicularly to a direction of flow of the molding material to be applied to the test chip.

6. A test chip as claimed in claim 4, wherein the slit has a width larger than a diameter of a largest one of the fillers, and each dam has a height smaller than the largest.

7. A test chip as claimed in claim 1, further comprising:
   an insulating layer formed on at least one transistor;
   a metalized layer formed on the insulating layer, connecting to at least one transistor; and,
   a passivation layer formed on the metalized layer.

8. A test chip as claimed in claim 7, wherein each dam is formed in parallel, and is formed to extend perpendicularly to a direction of flow of the molding material to be applied to the test chip.

9. A test chip as claimed in claim 7, wherein the slit has a width larger than a diameter of a largest one of the fillers, and each dam has a height smaller than the largest.

10. A test chip for a molding material including fillers, comprising:
    a semiconductor substrate;
    at least three test circuits formed on the substrate, each test circuit including at least one transistor; and
    at least four dams formed on the substrate for providing at least three slits therebetween, each slit capturing the fillers of the molding material when the molding material is applied to each test circuit.

11. A test chip as claimed in claim 10, wherein the dams are formed in parallel to each other to extend perpendicularly to a direction of flow of the molding material when the molding material is applied to the test circuits.

12. A test chip as claimed in claim 10, wherein each slit has substantially the same width, said width being larger than a diameter of a largest one of the fillers, and wherein each dam has a height smaller than the largest.

13. A test chip as claimed in claim 10, wherein the slits have different widths, the largest of the widths being larger than a diameter of a largest one of the fillers, and wherein each dam has a height smaller than the largest one of the fillers.

14. A test chip as claimed in claim 10, wherein each test circuit has at lease two transistors, further comprising:
    an insulating layer formed on the transistors; and
    a metalized layer formed on the insulating layer, connecting the transistors to each other under one of the slits.

15. A test chip as claimed in claim 14, wherein the dams are formed in parallel to each other to extend perpendicularly to a direction of flow of the molding material when the molding material is applied to the test circuits.

16. A test chip as claimed in claim 14, wherein each slit has substantially the same width, said width being larger than a diameter of a largest one of the fillers, and wherein each dam has a height smaller than the largest.

17. A test chip claimed in claim 14, wherein the slits have different widths, the largest of the widths being larger than a diameter of a largest one of the fillers, and wherein each dam has a height smaller than the largest one of the fillers.

18. A test chip as claimed in claim 10, wherein each test circuit has at lease two transistors, further comprising:
    an insulating layer formed on the transistors;
    a metalized layer formed on the insulating layer, connecting the transistors to each other under one of the slits; and
    a passivation layer formed on the metalized layer.

19. A test chip as claimed in claim 18, wherein the dams are formed in parallel to each other to extend perpendicularly to a direction of flow of the molding material when the molding material is applied to the test circuits.

20. A test chip as claimed in claim 18, wherein each slit has substantially the same width, said width being larger than a diameter of a largest one of the fillers, and wherein each dam has a height smaller than the largest.

21. A test chip as claimed in claim 18, wherein the slits have different widths, the largest of the widths being larger than a diameter of a largest one of the fillers, and wherein each dam has a height smaller than the largest one of the fillers.

22. A test chip for a molding material including fillers, comprising:
    a semiconductor substrate; and
    two dams formed on the substrate for providing a slit therebetween, the slit capturing the fillers of the molding material when the molding material is applied to the test chip.

23. A test chip as claimed in claim 22, wherein each dam is formed in parallel, and is formed to extend perpendicularly to a direction of flow of the molding material to be applied to the test chip.

24. A test chip as claimed in claim 22, wherein the slit has a width larger than a diameter of a largest one of the fillers, and each dam has a height smaller than the largest.

25. A test chip as claimed in claim 22, further comprising a layer formed on the substrate, the layer being softer than the fillers of the molding material.

26. A test chip as claimed in claim 25, wherein each dam is formed in parallel, and is formed to extend perpendicularly to a direction of flow of the molding material to be applied to the test chip.

27. A test chip as claimed in claim 25, wherein the slit has a width larger than a diameter of a largest one of the fillers, and each dam has a height smaller than the largest.

28. A test chip for a molding material including fillers, comprising:
    a semiconductor substrate;
    at least four dams formed on the substrate for providing at least three slits therebetween, each slit capturing the fillers of the molding material when the molding material is applied to the test chip.

29. A test chip as claimed in claim 28, wherein, each dam is formed in parallel, and is formed to extend perpendicularly to a direction of flow of the molding material to be applied to the test chip.

30. A test chip as claimed in claim 28, wherein each slit has substantially the same width, said width being larger than a diameter of a largest one of the fillers, and wherein each dam has a height smaller than the largest.

31. A test chip as claimed in claim 28, wherein the slits have different widths, the largest of the widths being larger than a diameter of a largest one of the fillers, and wherein each dam has a height smaller than the largest one of the fillers.

32. A test chip as claimed in claim 28, further comprising a layer formed on the substrate, the layer being softer than the fillers of the molding material.

33. A test chip as claimed in claim 32, wherein, each dam is formed in parallel, and is formed to extend perpendicularly to a direction of flow of the molding material to be applied to the test chip.

34. A test chip as claimed in claim 32, wherein each slit has substantially the same width, said width being larger than a diameter of a largest one of the fillers, and wherein each dam has a height smaller than the largest.

35. A test chip as claimed in claim 32, wherein the slits have different widths, the largest of the widths being larger than a diameter of a largest one of the fillers, and wherein each dam has a height smaller than the largest one of the fillers.

* * * * *